(12) United States Patent
Poon et al.

(10) Patent No.: US 9,176,394 B2
(45) Date of Patent: *Nov. 3, 2015

(54) IMMERSION LITHOGRAPHY APPARATUS AND METHOD HAVING MOVABLE LIQUID DIVERTER BETWEEN IMMERSION LIQUID CONFINEMENT MEMBER AND SUBSTRATE

(71) Applicant: NIKON CORPORATION, Tokyo (JP)

(72) Inventors: Alex Ka Tim Poon, San Ramon, CA (US); Leonard Wai Fung Kho, San Francisco, CA (US); Derek Coon, Redwood City, CA (US); Gaurav Keswani, Fremont, CA (US); Daishi Tanaka, Kumagaya (JP)

(73) Assignee: NIKON CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/082,739

(22) Filed: Nov. 18, 2013

(65) Prior Publication Data

US 2014/0071412 A1    Mar. 13, 2014

Related U.S. Application Data

(62) Division of application No. 12/382,100, filed on Mar. 9, 2009, now Pat. No. 8,610,873.

(60) Provisional application No. 61/193,350, filed on Nov. 20, 2008, provisional application No. 61/071,098, filed on Apr. 11, 2008, provisional application No. 61/064,630, filed on Mar. 17, 2008.

(51) Int. Cl.
*G03F 7/20* (2006.01)
*G03B 27/52* (2006.01)

(52) U.S. Cl.
CPC .......... *G03F 7/70341* (2013.01); *G03B 27/52* (2013.01)

(58) Field of Classification Search
CPC .................................... G03F 7/70341
See application file for complete search history.

(56) References Cited

U.S. PATENT DOCUMENTS 4,509,852 A    4/1985   Tabarelli et al.
7,075,616 B2   7/2006   Derksen et al.
(Continued)

FOREIGN PATENT DOCUMENTS

WO    WO 2005/111722 A3    11/2005

OTHER PUBLICATIONS

Oct. 13, 2011 Office Action issued in U.S. Appl. No. 12/382,100.
(Continued)

*Primary Examiner* — Peter B Kim
*Assistant Examiner* — Michelle Iacoletti
(74) *Attorney, Agent, or Firm* — Oliff PLC

(57) ABSTRACT

An immersion lithography apparatus that includes a substrate holder on which a substrate is held, a projection system having a final optical element and that projects an exposure beam onto the substrate through an immersion liquid, and a liquid confinement member having an aperture through which the exposure beam is projected, a lower surface including a non-fluid removal area surrounding the aperture, and a liquid recovery outlet from which the immersion liquid is recovered, also includes a movable member. The movable member is movable relative to the liquid confinement member in a substantially horizontal direction, and has an opening through which the exposure beam is projected. The movable member has upper and lower surfaces that surround the opening, and is movable while a portion of the upper surface faces the non-fluid removal area in the lower surface of the liquid confinement member.

19 Claims, 9 Drawing Sheets

(56) References Cited

U.S. PATENT DOCUMENTS

| | | |
|---|---|---|
| 7,292,313 B2 | 11/2007 | Poon et al. |
| 7,372,538 B2 | 5/2008 | Binnard |
| 8,134,685 B2 | 3/2012 | Nishii et al. |
| 8,610,873 B2 | 12/2013 | Poon et al. |
| 2006/0103817 A1* | 5/2006 | Ten Kate et al. ............ 355/30 |
| 2006/0176458 A1 | 8/2006 | Maria Derksen et al. |
| 2007/0109512 A1 | 5/2007 | Kate et al. |
| 2007/0109513 A1 | 5/2007 | Antonius Leenders et al. |
| 2007/0110213 A1 | 5/2007 | Leenders et al. |
| 2007/0279608 A1 | 12/2007 | Poon et al. |
| 2008/0225246 A1 | 9/2008 | Poon et al. |
| 2008/0231822 A1 | 9/2008 | Poon et al. |
| 2008/0231823 A1 | 9/2008 | Poon et al. |
| 2008/0284991 A1 | 11/2008 | Nishii |
| 2009/0237631 A1 | 9/2009 | Poon et al. |

OTHER PUBLICATIONS

Jul. 9, 2012 Office Action issued in U.S. Appl. No. 12/382,100.

Aug. 15, 2013 Notice of Allowance issued in U.S. Appl. No. 12/382,100.

\* cited by examiner

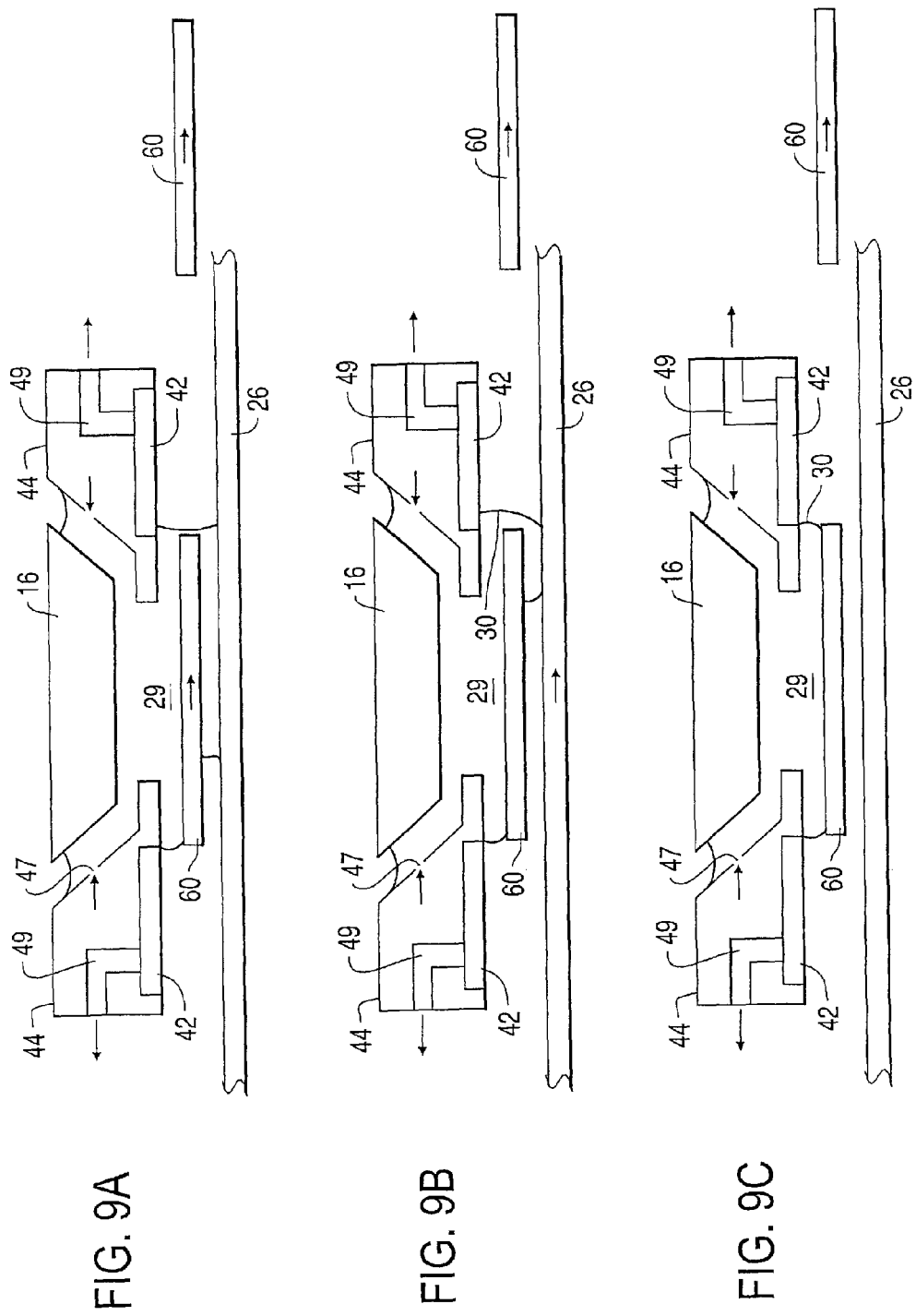

IMMERSION LITHOGRAPHY APPARATUS AND METHOD HAVING MOVABLE LIQUID DIVERTER BETWEEN IMMERSION LIQUID CONFINEMENT MEMBER AND SUBSTRATE

CROSS-REFERENCE TO RELATED APPLICATIONS

This is a divisional of U.S. patent application Ser. No. 12/382,100 filed Mar. 9, 2009 (now U.S. Pat. No. 8,610,873), which claims the benefit of U.S. Provisional Patent Application No. 61/064,630 filed Mar. 17, 2008, U.S. Provisional Patent Application No. 61/071,098 filed Apr. 11, 2008, and U.S. Provisional Patent Application No. 61/193,350 filed Nov. 20, 2008. The disclosure of each of these applications is incorporated herein by reference in its entirety.

BACKGROUND

The invention relates to immersion lithography apparatus and methods, and particularly to apparatus and methods for controlling the immersion liquid between the projection system and the substrate.

A typical lithography apparatus includes a radiation source, a projection optical system and a substrate stage to support and move a substrate to be imaged. A radiation-sensitive material, such as a resist, is coated onto the substrate surface before the substrate is placed on the substrate stage. During operation, radiation energy from the radiation source is used to project an image defined by an imaging element (such as, for example, a mask) through the projection optical system onto the substrate. The projection optical system typically includes a plurality of lenses. The lens or optical element closest to the substrate can be referred to as the last or final optical element.

The projection area during an exposure is typically much smaller than the imaging surface of the substrate. The substrate therefore has to be moved relative to the projection optical system to pattern the entire surface of the substrate. In the semiconductor industry, two types of lithography apparatus are commonly used. With so-called "step and repeat" apparatus, the entire image pattern is projected at once in a single exposure onto a target area of the substrate. After the exposure, the wafer is moved or "stepped" in the X and/or Y direction and a new target area is exposed. This step and repeat process is performed over and over until the entire substrate surface is exposed. With scanning type lithography apparatus, the target area is exposed in a continuous or "scanning" motion. The imaging element is moved in one direction, while the substrate is moved in either the same or the opposite direction during exposure. After each scan, the substrate is then moved in the X and/or Y direction to the next scan target area. This process is repeated until all the desired areas on the substrate have been exposed.

Lithography apparatus are typically used to image or pattern semiconductor wafers and flat panel displays. The term "substrate", as used herein, is intended to generically mean any work piece that can be patterned, including, but not limited to, semiconductor wafers and flat panel displays.

Immersion lithography systems use a layer of fluid that fills a gap between the final optical element of the projection optical system and the substrate. The fluid enhances the resolution of the system by enabling exposures with a numerical aperture (NA) greater than one, which is the theoretical limit for conventional "dry" lithography. The fluid in the gap permits the exposure with radiation that would otherwise be completely internally reflected at the optical-air interface. With immersion lithography, numerical apertures as high as the index of refraction of the fluid are possible. Immersion also increases the depth of focus for a given NA, which is the tolerable error in the vertical position of the substrate, compared to a conventional dry lithography system. Immersion lithography therefore has the ability to provide greater resolution than can be performed using conventional dry lithography, as the fluid essentially becomes part of the optical system of the lithography apparatus.

One known way of maintaining the immersion fluid in the gap where exposure of the substrate is to occur is with the use of an air curtain. For more information on air curtain type immersion apparatus, see for example U.S. Patent Publication No. 2005/0007569, the disclosure of which is incorporated herein by reference in its entirety.

It is also known to maintain the immersion fluid in the gap between the final optical element and the imaging surface of the substrate by submersing both in a container filled with immersion fluid. See, for example, U.S. Pat. No. 4,509,852, the disclosure of which is incorporated herein by reference in its entirety.

Another known way of maintaining the immersion fluid within the gap of an immersion lithography apparatus is with the use of a confinement member that surrounds the final optical element immediately above the area to be exposed on the substrate. For more information on confinement member type immersion lithography apparatus, see U.S. Pat. No. 7,292,313 and WO 2005/111722, the disclosure of each of which is incorporated herein by reference in its entirety.

In yet another approach, which is a variation of the above-described submersion type apparatus, a large confinement plate is used for submerging the substrate to be imaged in the immersion fluid. For more details on confinement plate type immersion lithography apparatus, see U.S. Patent Publication No. 2007/0279608, the disclosure of which is incorporated herein by reference in its entirety.

During semiconductor wafer fabrication, for example, wafers are typically patterned one after another by the lithography tool. After a wafer has been patterned, it is replaced and the next wafer is exposed. This process is completed over and over, typically as fast as possible, to increase throughput. During a wafer exchange, the just exposed wafer typically has to be moved a relatively long distance from the exposure area to the wafer exchange area. This movement preferably is performed at a relatively high speed. Once the exchange takes place, the new wafer undergoes another relatively long-move to an alignment area. This movement also preferably is performed at a relatively high speed. After alignment, the wafer undergoes yet another long-move back to the exposure area for exposure. This movement also preferably is performed at a relatively high speed. For the sake of simplicity, all of the above-described moves are hereafter generically referred to as "long-moves".

It also is desirable to move from target area to target area on a substrate during the exposure operation at a relatively high speed. Furthermore, when exposure of a target area begins in a scanning exposure apparatus, it is desirable to accelerate at as high a rate as possible at the beginning of the scanning movement and to scan across the target area during exposure of the target area at as high a speed as possible.

High speed movements are desirable in order to increase the throughput (the rate of production) of the exposure process performed by the lithography apparatus.

High speed moves can be problematic with confinement member type immersion apparatus. In particular, if the speed is too fast, there is a tendency for the immersion fluid to leak out from under the confinement member, leaving a trail of water (or other liquid if a liquid other than water is used as the immersion fluid) behind on the substrate. Liquid that escapes from the liquid confinement member also can scatter inside the exposure apparatus, which can deteriorate components of the exposure apparatus and/or adversely change the environmental conditions (for example, temperature and humidity) within the apparatus.

U.S. Patent Publication No. 2007/0110213 discloses a plate disposed on a barrier member that confines a liquid between the projection system and the substrate. The plate separates the liquid-filled space between the barrier member and the substrate into upper and lower channels, such that a meniscus is formed in each of the channels.

SUMMARY

According to a first aspect of the invention, a movable liquid diverter is positioned between a liquid confinement member and a substrate (or other object that may be located below the projection system and confinement member) in an immersion lithography apparatus. The apparatus includes a substrate holder on which the substrate having an imaging surface is held, and a projection system having a final optical element. The projection system projects an image onto a target imaging area on the imaging surface of the substrate held on the substrate holder through an immersion liquid that is filled in a gap between the imaging surface of the substrate and the final optical element. The liquid confinement member maintains the immersion liquid in the gap between the imaging surface of the substrate and the final optical element. The immersion liquid has a meniscus where the immersion liquid is in contact with ambient gas. The meniscus defines a footprint of the immersion area of the immersion liquid.

The movable liquid diverter is movable relative to the liquid confinement member in a direction parallel to the imaging surface of the substrate. The movable liquid diverter includes an opening that surrounds the immersion area. The opening can contact the liquid in the immersion area or it can be slightly spaced from the liquid in the immersion area (that is, the opening can be slightly spaced from the meniscus) when the substrate holder is stationary.

The movable liquid diverter moves in a same direction as the substrate holder (and the held substrate) when the substrate holder moves the substrate in a direction parallel to the imaging surface. Preferably, the liquid diverter is moved at a speed that is slower than a speed at which the substrate holder moves. Preferably, the liquid diverter is moved by an amount that is less than an amount by which the substrate holder moves. Moving the liquid diverter when the substrate holder is moved functions to reduce (or preferably prevent) liquid from being scattered from between the liquid confinement member and the substrate surface when the substrate is moved.

This aspect of the invention is particularly helpful in preventing scattering of liquid during high-speed movements of the substrate holder. Thus, according to some embodiments, the liquid diverter only is moved when the substrate holder is moved at a speed higher than a predetermined speed. Such a movement reduces the relative difference in speed between the liquid and the surfaces contacted by the liquid.

The apparatus can include a drive system such as an actuator coupled to the liquid diverter so as to move the liquid diverter. The drive system can be a voice coil motor, a Lorentz-force actuator or other actuators that are capable of moving the liquid diverter by a suitable distance.

The liquid diverter can be a single plate having an opening or it can be a plurality of plates that collectively define the opening.

The opening of the liquid diverter is larger than the liquid confinement member aperture (through which an exposure beam is being projected) so that movement of the liquid diverter does not block the exposure beam.

According to some embodiments, the liquid diverter has a surface with an area larger than the liquid confinement member aperture so that the liquid diverter can function as a shutter or cover plate that blocks the liquid confinement member aperture to maintain liquid between the projection system final optical element and the liquid confinement member, for example, when the substrate holder is moved away from the projection system during substrate exchange, etc.

According to another aspect of the invention, movement of the substrate holder (or other object located below the projection system and liquid confinement member) can be used to enhance the shutter-insertion process. For example, the substrate holder can be moved in a direction parallel to the substrate surface prior to insertion of the shutter (whether the shutter be the liquid diverter or a dedicated shutter) so that the meniscus on one side of the liquid confinement member aperture is moved to a position closely adjacent to the edge of the aperture. The shutter then is moved in the same direction as the substrate holder while the substrate holder continues to move, to insert the shutter between the liquid confinement member aperture and the substrate holder. This improves the removal of liquid from the substrate surface (i.e., from beneath the shutter or from between the shutter and the substrate surface) at a position downstream of the shutter relative to the motion direction of the shutter.

Preferably, the shutter is shaped to have a size such that it does not cover the liquid recovery portion on the lower surface of the liquid confinement member (or a size that covers only a part of the liquid recovery portion) when the shutter is in the position at which it completely covers the liquid confinement member aperture. This enables the liquid recovery portion to efficiently recover liquid remaining on the substrate surface once the liquid confinement member aperture is covered.

According to some embodiments, the shutter is positioned so that a leading edge of the shutter is located adjacent to the edge of the liquid confinement member aperture just as the previously-conducted exposure operation is completed so that insertion of the shutter over the liquid confinement member aperture can start as quickly as possible after the completion of an exposure operation on a substrate.

According to another aspect of the invention, after the shutter is positioned over the aperture by moving the shutter in one direction (for example, the X direction) parallel to the substrate surface, the substrate table is moved in a direction perpendicular to the direction in which the shutter was moved but parallel to the substrate surface (for example, the Y direction) so as to cause liquid present below the shutter to move to a corner of the shutter. The liquid collected near the corner of the shutter can be more easily recovered, for example, by providing the corner of the shutter with a shape that will cause collected liquid to easily flow to the liquid recovery portion disposed on the lower surface of the liquid confinement member.

According to another aspect of the invention, the substrate holder (or other object disposed below the projection system and liquid confinement member) can be moved in a direction that assists in reducing the formation of bubbles when the shutter is removed from its position over the liquid confinement member aperture. For example, the substrate table can be moved in the same direction in which the shutter is moved away as the shutter moves away from its position covering the liquid confinement member aperture.

BRIEF DESCRIPTION OF THE DRAWINGS

FIGS. 9A-9C are cross section views of the liquid diverter used as a shutter or closing plate to maintain liquid in contact with the projection system final optical element, for example, during substrate exchange;

DETAILED DESCRIPTION OF EMBODIMENTS

Figure 1A:
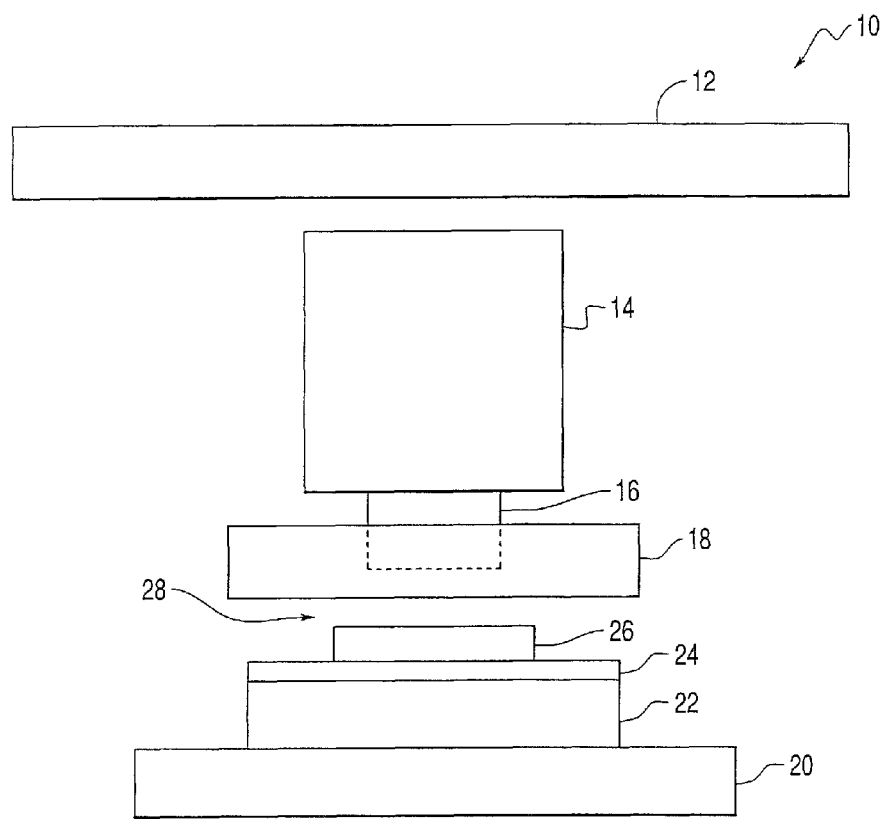
FIG. 1A is a diagram of an immersion lithography apparatus according to one embodiment of the invention.

Referring to FIG. 1A, an immersion lithography apparatus is shown. The immersion lithography apparatus 10 includes an imaging element 12 which defines an image, a projection optical system 14 which includes a "last" or "final" optical element 16, a liquid confinement member 18, a coarse stage 20, a fine stage 22, and a substrate chuck 24 for holding a substrate 26, and a space 28 under the final optical element 16 and the liquid confinement member 18. The space 28 includes a gap provided between the top surface of the substrate 26 and the final optical element 16, when the final optical element 16 and the top surface of the substrate 26 are opposite to each other. In one embodiment, the liquid confinement member 18 is a confinement member by which the gap between the substrate 26 and the final optical element 16 is filled with an immersion fluid 29 (not visible in FIG. 1A). Again, for more information on confinement member type immersion lithography apparatus, see U.S. Pat. No. 7,292,313 and WO 2005/111722, the disclosures of which are incorporated herein by reference in their entireties.

Figure 1B:
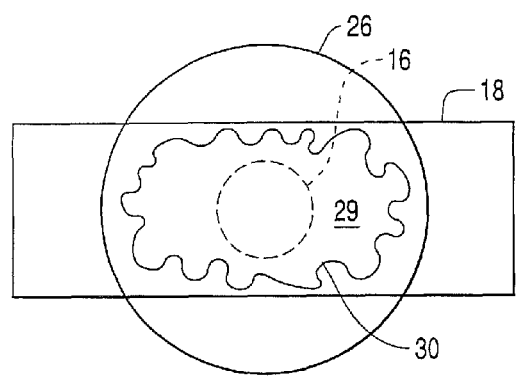
FIG. 1B is a diagram illustrating the meniscus footprint of the immersion liquid disposed between a substrate and the liquid confinement member.

Referring to FIG. 1B, a top-down view of the immersion fluid 29 between the liquid confinement member 18 and the final optical element 16 on one side and the substrate 26 on the other side is shown. In one embodiment, the immersion fluid 29 is a liquid, such as water. The perimeter or the meniscus 30 of the immersion fluid 29, which is defined as the interface where the immersion fluid 29 is in contact with the ambient gas, defines a "footprint" or an outer shape of the body of fluid 29 under the liquid confinement member 18. When the substrate 26 is moved, during a long, high-speed move for example, the meniscus 30 of the body of fluid 29 may be altered in an undesirable way. It should be noted that the diagram of FIG. 1B is for illustrative purposes, and is not necessarily drawn to scale. Also a number of elements, such as the remainder of the projection optical system 14 and the substrate chuck 24, are not shown for the sake of clarity.

The present embodiment is directed to a movable liquid diverter 60 positioned under the liquid confinement member 18. The movable liquid diverter 60, as described in detail below, is configured to alter or control the footprint shape of the body of immersion fluid 29 particularly during relatively high speed movements of the substrate 26. The diverter 60 can help to prevent the formation of fingers of immersion fluid from the immersion area and minimize (preferably prevent) leakage of immersion fluid from between the liquid confinement member 18 and the substrate. In the following explanation, although the substrate 26 is positioned or moved under the liquid confinement member 18 and the optical element 16, an object other than the substrate 26 can be positioned or moved under the liquid confinement member 18 and the optical element 16. The object could be, for example, a measurement stage having measuring devices provided on an upper surface thereof.

Figure 2A:
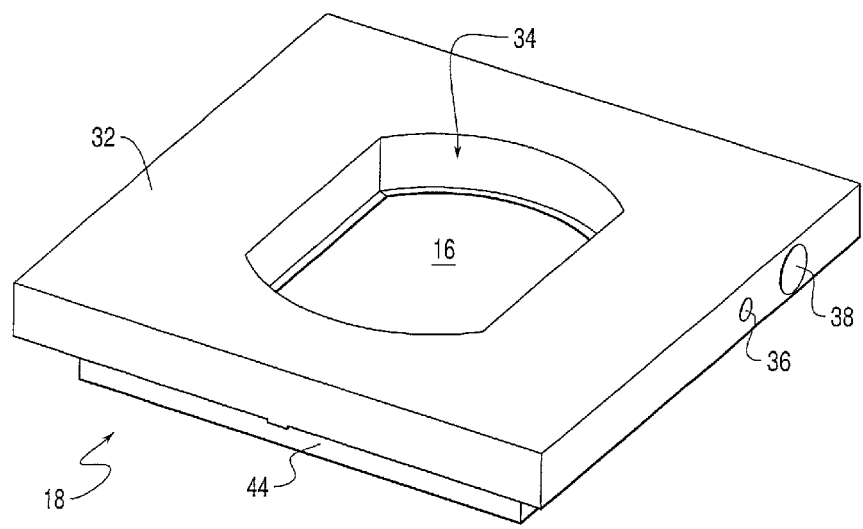
FIG. 2A is a top perspective view of a liquid confinement member according to one embodiment of the invention.
Figure 2B:
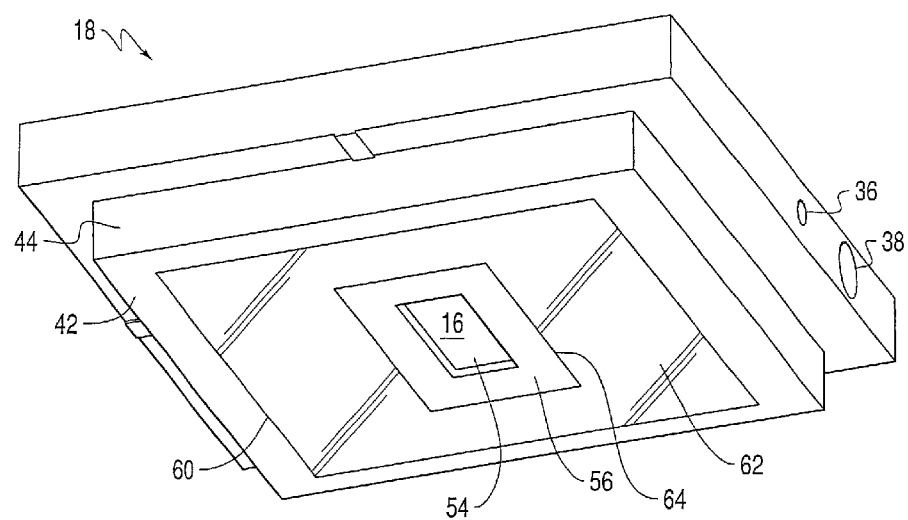
FIG. 2B is a bottom perspective view of the FIG. 2A liquid confinement member and also shows a movable liquid diverter.

Referring to FIGS. 2A-2B, top and bottom perspective views of the liquid confinement member 18 with a movable liquid diverter 60, according to one embodiment, are shown. In this embodiment, the movable liquid diverter 60 is a single plate 62 having a central opening 64. However, the invention is not limited to the illustrated configuration. For example, the movable liquid diverter 60 could be formed from a plurality of separately movable and controllable plates. For example, four rectangular plates, one on each of the four sides of the opening 64 could be provided. Alternatively, two L-shaped plates could be provided, with each of the plates extending along two adjacent sides of the opening 64. The shape of the plate(s) and opening formed by the plates need not be rectangular.

FIG. 2A shows a top-down perspective view of the liquid confinement member 18. The liquid confinement member 18 includes a top plate 32, a bottom plate 44 and a recess 34. A part of the final optical element 16 is positioned within the recess 34 (for the sake of clarity, the remainder of the projection optical system 14 is not illustrated). The liquid confinement member 18 also includes at least one fluid supply inlet 36 and outlet 38 for supplying and recovering the immersion fluid respectively. Again for the sake of simplicity, only one inlet 36 and outlet 38 is shown. In alternative embodiments, a plurality of inlets 36 and outlets 38 may be used.

FIG. 2B shows a bottom-up perspective view of the liquid confinement member 18, including a liquid recovery portion 42 provided on the bottom plate 44. As illustrated in this view, the liquid recovery portion 42 is provided between the bottom plate 44 of the liquid confinement member 18 and the liquid diverter 60. The liquid confinement member 18 (the bottom plate 44) includes an aperture 54, which is positioned at the center of the bottom plate 44 and under the final optical element 16, and through which the image is projected onto the top surface of the substrate 26. The liquid confinement member 18 (the bottom plate 44) includes a non-fluid removal area 56 which surrounds the aperture 54. The non-fluid removal area 56 is provided for containing the immersion fluid 29. The liquid recovery portion 42 is provided further away from the aperture 54 than the non-fluid removal area 56. In this embodiment, the liquid recovery portion 42 surrounds the non-fluid removal area 56. The liquid recovery portion 42 has a bottom surface that partially faces the liquid diverter 60. In this embodiment, the bottom surface of the liquid recovery portion 42 is substantially co-planar with the surface of the non-fluid removal area 56. In one embodiment, the bottom surface of the liquid recovery portion 42 may not be co-planar with the surface of the non-fluid removal area 56. For example, the bottom surface of the liquid recovery portion 42 may be provided further away from the top surface of the substrate 26 than the non-fluid removal area 56. The liquid recovery portion 42 is configured to contain and remove the immersion fluid 29.

The liquid diverter 60 is provided under the liquid confinement member 18 (i.e., between the liquid recovery portion 42 and the substrate 26). In the illustrated embodiment, the liquid diverter 60 is a single rectangular plate 62 having a rectangular, central opening 64. As is apparent from FIG. 2B, the size of opening 64 is larger than the size of aperture 54 in the liquid confinement member 18. The opening 64 is larger than the aperture 54 so that when the liquid diverter 60 moves in the direction parallel to the surface of substrate 26, the opening 64 does not block the exposure beam that is being projected through the projection system 14 and the aperture 54. Thus, during an exposure operation, liquid diverter 60 will move by no more than an amount that would cause the edge of opening 64 to align with the edge of aperture 54.

The liquid diverter 60 could be mounted to the liquid confinement member 18. The liquid confinement member preferably is mounted to a support member within the exposure apparatus 10, the support member being different from a support member that supports the projection system 14 so that vibrations of the liquid confinement member 18 are not transmitted to the projection system 14. The liquid diverter 60 also could be mounted to the support member that supports the liquid confinement member 18 instead of being mounted to the liquid confinement member 18.

Figure 7:
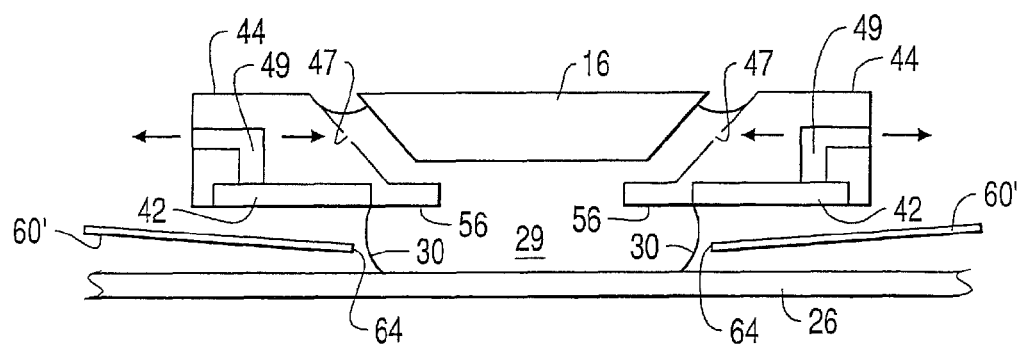
FIG. 7 is a cross section view of an embodiment that includes a sloped liquid diverter.
Figure 8:
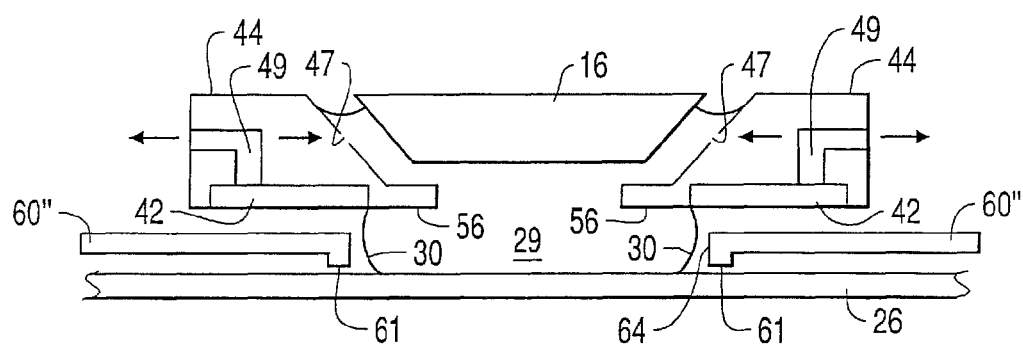
FIG. 8 is a cross section view of an embodiment in which the liquid diverter has a protrusion formed on its lower surface around the opening in the liquid diverter.

In some embodiments, the lower surface of the liquid diverter 60 is parallel to the upper surface of substrate 26. However, it is not necessary for the lower surface of liquid diverter 60 to be parallel to the upper surface of the substrate 26. For example, as shown in FIG. 7, the diverter 60' may be sloped relative to the upper surface of the substrate 26 such that the lower surface of diverter 60' slopes upwardly such that the distance between the lower surface of liquid diverter 60' and the substrate 26 increases as one moves farther away from the opening 64. The sloped diverter 60' helps to center the meniscus. As shown in FIG. 8, it also is possible to provide a protrusion (such as, for example, a step 61) on the lower surface of liquid diverter 60" around the opening 64 in order to help define the footprint of the immersion liquid between the substrate 26 and the liquid diverter 60".

During operation, the immersion fluid 29 is introduced into the liquid confinement member 18 through the one or more inlets 36. The fluid 29 fills at least part of the space 28, including the gap between the optical element 16 and the substrate 26 and at least part of a gap between the non-fluid removal area 56 and the substrate 26. The liquid recovery portion 42 recovers the fluid 29 and passes it through the one or more outlets 38, where it can be either discarded or reused. In various embodiments, the liquid recovery portion 42 can be a mesh, a porous material (porous member), or outlets. For more details of these types of liquid recovery portions, see, for example, U.S. Pat. No. 7,292,313, and WO 2005/111722.

Figure 3:
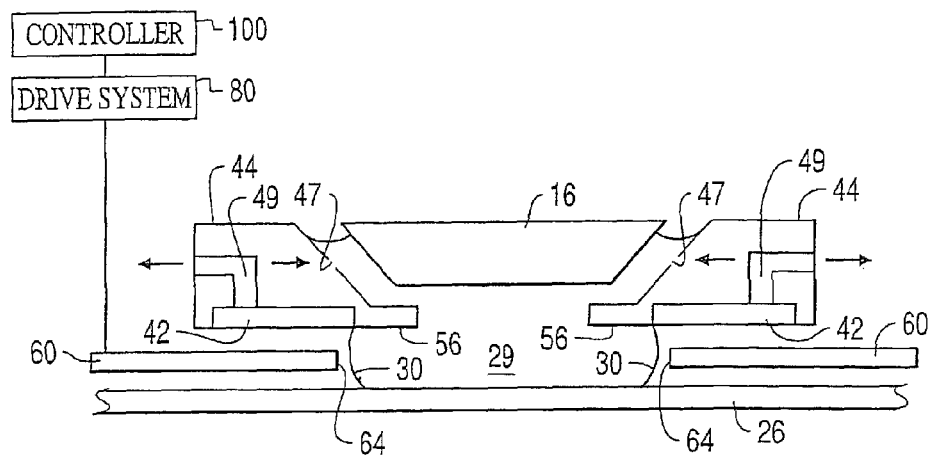
FIG. 3 is a cross section view of a liquid diverter according to a first embodiment positioned so that its opening is spaced from the meniscus formed between a liquid confinement member and a substrate when the substrate is stationary.

FIG. 3 is a cross section view showing the immersion fluid 29 in the space 28 between the final optical element 16, the liquid confinement member 18 and the substrate 26. As shown in FIG. 3, the liquid diverter 60 is disposed between the liquid confinement member 18 and the substrate 26. In the FIG. 3 embodiment, the opening 64 of the liquid diverter 60 is spaced a small distance from the meniscus 30 that forms between the substrate 26 and the lower surface of the bottom plate 44 of the liquid confinement member 18. FIG. 3 also shows liquid inlet ports 47 provided on the bottom plate 44, which supply the immersion fluid to the space 28. FIG. 3 also shows liquid recovery outlets 49 provided in the bottom plate 44 and which connect a chamber holding the porous member of the liquid recovery portion 42 with, for example, a vacuum. FIG. 3 also shows a controller 100 which can be, for example, control circuitry or a programmed computer, which controls the movement of the liquid diverter 60. In particular, controller 100 causes actuator or other drive system 80, which is coupled to the liquid diverter 60, to move the liquid diverter 60 as described below.

Figure 4:
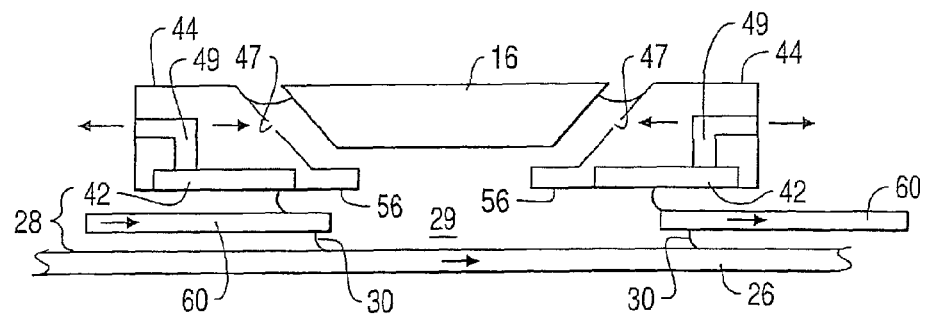
FIG. 4 is a cross section view of the FIG. 3 system and shows how the liquid diverter moves when the substrate is moved.

As indicated above, FIG. 3 shows the position of the liquid diverter relative to the meniscus 30 when the substrate 26 is stationary. When the substrate is moved, the liquid diverter 60 will be moved in the same direction as the substrate 26. FIG. 4 shows such movement of the liquid diverter 60. In particular, in FIG. 4, the substrate 26 is moved from left-to-right (by moving the substrate stage 20 from left-to-right) as indicated by the arrow on substrate 26. Simultaneously with this movement, the liquid diverter 60 is moved from left-to-right as indicated by the arrow on the diverter 60. Preferably, the liquid diverter 60 is moved by an amount and at a speed which is less than the movement amount and speed by which the substrate 26 is moved.

Moving the liquid diverter 60 as described above has been found to reduce or eliminate scattering of liquid that can be caused by high speed movements of the substrate 26 (or other object that is being moved below the projection system and liquid confinement member). It is believed that the scattering of liquid is reduced or eliminated because the liquid diverter reduces the relative difference in moving speeds of the two surfaces between which the meniscus is formed. For example, if no liquid diverter was provided, the relative difference in speed between the two surfaces between which the meniscus is formed (the two surfaces would be the lower surface of the bottom plate 44 and the upper surface of the substrate 26) would be equal to the movement speed of the substrate 26. By disposing the liquid diverter plate 60 between the lower surface of bottom plate 44 and the upper surface of substrate 26, and moving the liquid diverter in the same direction as the substrate but at a lower speed, the meniscus formed between the lower surface of bottom plate 44 and the upper surface of liquid diverter 60 will be subjected to a surface speed differential equal to the movement speed of the liquid diverter 60 (which is less than the movement speed of the substrate 26). Similarly, the meniscus formed between the lower surface of the liquid diverter 60 and the upper surface of the substrate 26 will be subjected to a surface speed differential equal to the difference between the substrate speed and the liquid diverter speed (which will be less than the movement speed of the substrate 26). Thus, both of the meniscus will be subjected to less force than would occur if no liquid diverter plate was provided or if the liquid diverter plate was stationary or moved at a speed equal to or higher than the speed at which the substrate is moved.

The liquid diverter 60 does not need to move by an amount equal to the amount by which the substrate 26 is moved. Rather, the liquid diverter 60 can be moved by a maximum amount equal to, for example, 20-30 mm. After moving, the liquid diverter 60 can be returned to the position shown in FIG. 3. Because it is common for substrates to be moved in alternating directions as each device region (also called a "shot region") is exposed, it is easily possible to implement the above-described process because the substrate and liquid diverter would be moved from left-to-right for a first device region, then moved from right-to-left for the next device region, then moved from left-to-right for the next device region, and so on. For long movements of the substrate stage, the movement amount of the liquid diverter still is kept to no more than about 20-30 mm, which is effective at preventing scattering of liquid from between the lower surface of bottom plate 44 and the upper surface of substrate 26.

As mentioned above, the actuator or drive system 80 of the liquid diverter 60 can be, for example, a voice coil motor, a pneumatic actuator or a Lorentz force actuator since such devices are readily capable of producing a movement of 20-30 mm. The drive does not need to be highly accurate.

Depending on the speed at which the substrate 26 is moved, it may not be necessary to move the liquid diverter 60 while the substrate 26 is moved. That is, because the liquid scattering problem typically does not occur for slower movement speeds of the substrate, according to some aspects of the invention, the liquid diverter 60 remains stationary relative to the projection system and the liquid confinement member 18 when the substrate 26 is moved at slower speeds, but is moved relative to the projection system and the liquid confinement member when the substrate is moved at a speed higher than a predetermined speed. For example, if liquid scattering does not occur for substrate speeds below 300 mm/sec, it would not be necessary to move the liquid diverter if the substrate is moved at speeds below 300 mm/sec. Then, when the substrate 26 is moved at speeds higher than 300 mm/sec, the liquid diverter would be moved. For example, in the above example in which 300 mm/sec is the threshold for liquid scattering, when the substrate is moved at a speed of, for example, 400 mm/sec, the liquid diverter could be moved in the same direction as the substrate but at a speed of 100 mm/sec. This would prevent the relative speed between two facing surfaces between which a meniscus is formed from exceeding the 300 mm/sec threshold. Thus, the movable liquid diverter 60 facilitates higher speed substrate movements than would be obtainable (without liquid scattering) without the diverter 60. It is noted that the speed thresholds described above are merely examples, and will vary depending on the type of immersion liquid, the size of the gap 28 and the materials used to form (or coat) the substrate surface, the liquid diverter surfaces and the lower surface of the bottom plate.

The surfaces of the liquid diverter can be made to be liquid-attractive (lyophilic) or liquid-repellent (lyophobic). For example, both the upper and lower surfaces of diverter 60 could be lyophilic. Alternatively, both the upper and lower surfaces of diverter 60 could be made lyophobic. As another alternative, the upper surface of the diverter 60 could be made lyophilic and the lower surface made lyophobic. As another alternative, the upper surface of diverter 60 could be made lyophobic and the lower surface could be made lyophilic. Preferably, both the upper and lower surfaces of the diverter 60 are lyophobic so that liquid does not remain on the diverter 60 when it is inactive.

In the embodiments described herein, in which no air curtain is used to maintain liquid between the liquid confinement member 18 and the substrate 26, a larger gap 28 can be provided between the lower surface of bottom/plate 44 and the upper surface of substrate 26, which makes it easier to provide the liquid diverter 60 between the liquid confinement member 18 and the substrate 26. For example, the distance between the lower surface of bottom plate 44 and the upper surface of substrate 26 can be, for example, 1 mm.

Figure 5:
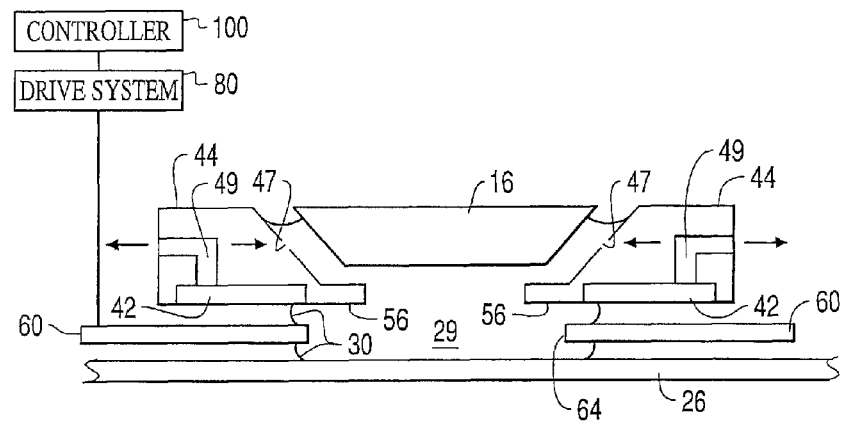
FIG. 5 is a cross section view of a liquid diverter according to another embodiment in which an edge of the opening of the liquid diverter contacts the meniscus formed between the liquid confinement member and the substrate when the substrate is stationary.
Figure 6:
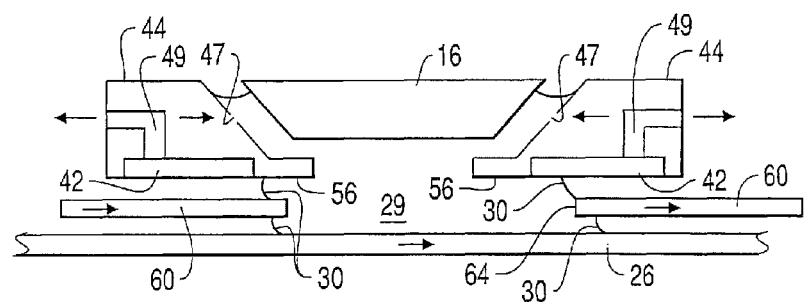
FIG. 6 is a cross section view of the FIG. 5 embodiment and shows how the liquid diverter moves when the substrate moves.

FIG. 5 shows an embodiment similar to the FIG. 3 embodiment except that the opening 64 of the liquid diverter 60 is positioned so as to contact the meniscus 30 when the substrate 26 is stationary, as shown in FIG. 5. Thus, if the liquid diverter 60 is a single plate 62 having an opening 64, the FIG. 5 embodiment has a smaller opening than the FIG. 3 embodiment. If the liquid diverter 60 is made from a plurality of movable plates, then the positioning of those plates can be controlled by controller 100 and drive system 80 so that the opening formed by the inner edges of the plates is smaller than in the FIG. 3 embodiment. As shown in FIG. 6, when the substrate 26 is moved, the liquid diverter 60 is moved in the same direction (but at a lower speed) than the substrate, as in the embodiment described above with respect to FIGS. 3 and 4.

FIG. 7 shows an embodiment similar to the FIG. 3 embodiment except that the liquid diverter 60' is sloped. A sloped liquid diverter 60' helps to center the meniscus relative to the opening 64.

FIG. 8 shows an embodiment similar to the FIG. 3 embodiment except that the lower surface of the liquid diverter 60" includes a protrusion 61 extending around the opening 64. The protrusion 61 helps to define the shape of the meniscus.

The sloped structure of FIG. 7 or the FIG. 8 structure having a protrusion 61 can be applied to the FIG. 5 embodiment as well as to the FIG. 3 embodiment.

FIGS. 9A-9C are cross section views showing the liquid diverter 60 used as a shutter or cover plate to cover the opening 54 in the bottom plate 44 of the immersion confinement member 18. The liquid diverter can be any of the previously described liquid diverters, and is moved by drive system 80 as controlled by controller 100. As shown in FIG. 9A, one side of the liquid diverter 60 (for example, one side of the rectangular plate 62 or, if the liquid diverter is made from a plurality of separate, rectangular plates, then one of those plates) has a size such that its surface is larger than or equal in area to the non-fluid removal area 56 formed in the bottom plate 44. This enables the liquid diverter 60 to be used as a shutter. FIG. 9A shows the liquid diverter 60 moved such that a portion of the liquid diverter 60 functions as a shutter in which liquid is maintained between the final optical element 16 and the upper surface of the liquid diverter 60. As shown in FIG. 9B, after the liquid diverter 60 is moved to cover aperture 54, the substrate holder moves the substrate 26 (from left-to-right in FIG. 9B) so as to move the liquid disposed under the liquid diverter 60 to the right where it can be recovered by the liquid recovery portion 42 located on the right side of the bottom plate 44 in FIG. 9B. FIG. 9C shows the condition in which all liquid below the liquid diverter 60 (that is, all liquid that remained on the upper surface of substrate 26) has been removed. The substrate holder then can be moved away from the projection system so that an exposed substrate can be replaced with a substrate that is to be exposed by the projection system.

As shown in FIG. 9A-9C, it is preferable that the size of the portion of the liquid diverter 60 that is used as a shutter is such that it does not cover the liquid recovery portion 42 when the liquid diverter 60 is covering the bottom plate aperture 54. In the embodiment shown in FIGS. 9A-9C, none of the liquid recovery portion 42 is covered by the liquid diverter 60. It is, however, acceptable to cover part of the liquid recovery portion 42. It is preferable that at least some of the liquid recovery portion 42 is not covered to assist in removal of immersion liquid from the upper surface of substrate 26.

Figure 10A:
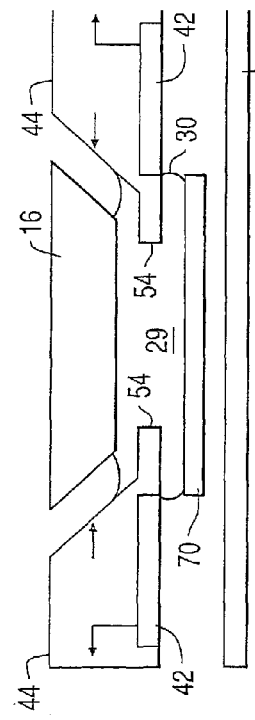
FIGS. 10A-10E are cross section views showing a process for inserting a shutter between the liquid confinement member and the substrate, and for removing the shutter from that position.
Figure 10B:
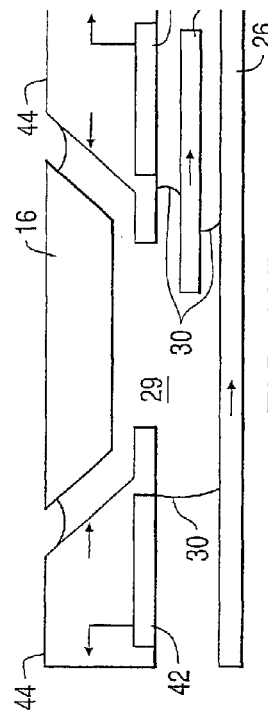

FIGS. 10A-10B illustrate a process of inserting a shutter between the bottom plate 44 of the liquid confinement member 18 and the substrate 26. The shutter could be a dedicated shutter or it could be, for example, the liquid diverter 60 described in any of the previous embodiments. This process is performed to minimize the shutter insertion time.

Figure 10C:
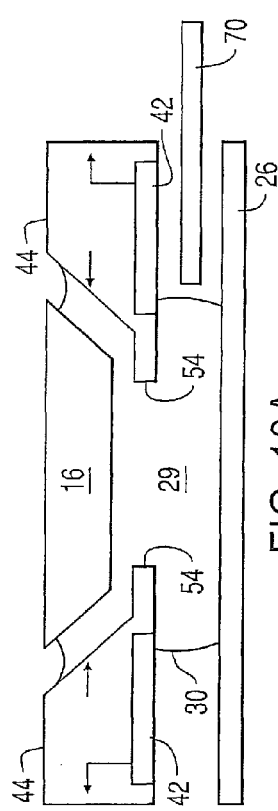

FIG. 10A shows the liquid 29, including meniscus 30, formed between lower plate 44 and substrate 26 when the substrate 26 is stationary. As shown in FIG. 10B, before the shutter 70 is inserted over the bottom plate aperture 54, the substrate 26 is moved (from right-to-left in FIG. 10B) so that the immersion area moves from right to left such that the right side of the meniscus 30 is positioned closely adjacent to the edge of bottom plate aperture 54 on the right side of the aperture 54. Also, the immersed footprint can be reduced to a minimum size. Then, preferably while the substrate 26 continues to move in the right-to-left direction, the shutter 70 is inserted between the bottom plate 44 and the substrate 26 by also moving the shutter 70 in the right-to-left direction. This manner of inserting the shutter 70 helps to move much of the immersion liquid 29 to the left so that it can be quickly recovered by the liquid recovery portion 42 disposed on the left side of the bottom plate 44 in FIG. 10C. Movement of the substrate 26 before and during shutter insertion thus changes the shape of the immersion liquid body so as to aid in liquid recovery.

In the above-described shutter insertion process, it is also desirable to place the shutter 70 at a position where its leading edge is aligned with an edge of the aperture 54 just as the preceding exposure operation is completed. This enables insertion of the shutter 70 over the aperture 54 to begin immediately upon completion of the exposure of the last shot region on the substrate 26. Thus, for example, in the previous example, the leading edge (the left edge) of the shutter 70 would be located below the right edge of aperture 54 in FIGS. 10A and 10B. It is particularly easy to do this when the liquid diverter 60 is used as a shutter because the liquid diverter 60 will be close to this position during its normal operation.

Figure 10D:
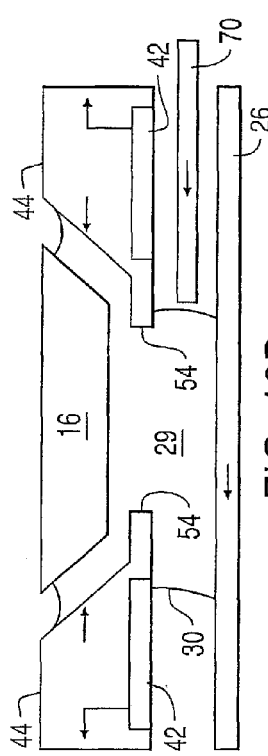

FIG. 10D shows the final position of the shutter 70 in which the bottom plate aperture 54 is completely covered. Preferably, after the shutter 70 reaches the position shown in FIG. 10D, the substrate then is moved in a direction perpendicular to the right-to-left position (that is, in a direction that would extend into and out of the page). This causes liquid that may exist between the lower surface of shutter 70 and the upper surface of substrate 26 to be moved to a corner of the shutter 70 (assuming that the shutter 70 is rectangular). By moving liquid to the corner of the shutter 70, the liquid is accumulated into a larger mass and thus can be more easily collected by the liquid recovery portion 42. In addition, the corner of the shutter can be provided with a notch or taper to further assist in removal of liquid from below the corner of the shutter 70.

Figure 10E:
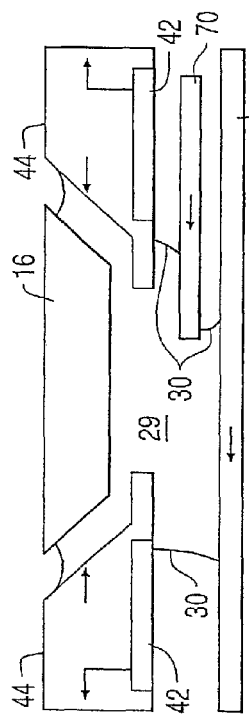

FIG. 10E shows a preferred process of removing the shutter 70 from between the bottom plate 44 of liquid confinement member 18 and the substrate 26. It is desirable to quickly move the shutter 70 in order to increase throughput of the exposure apparatus. However, if the shutter 70 is moved too quickly, bubbles can be formed in the immersion liquid 29 disposed between the final optical element 16 and the substrate 26. Thus, as shown in FIG. 10E, while the shutter 70 is moved (from left-to-right) in FIG. 10E, the substrate 26 also is moved from left-to-right. It has been found that moving the substrate and shutter in the same direction during removal of the shutter from the position at which it closes the bottom plate aperture 54 reduces the formation of bubbles between the final optical element 16 and the substrate 26.

The use of the exposure apparatus described herein is not limited to a photolithography system for semiconductor manufacturing. The exposure apparatus, for example, can be used as an LCD photolithography system that exposes a liquid crystal display device pattern onto a rectangular glass plate, or a photolithography system for manufacturing a thin film magnetic head.

Figure 11A:
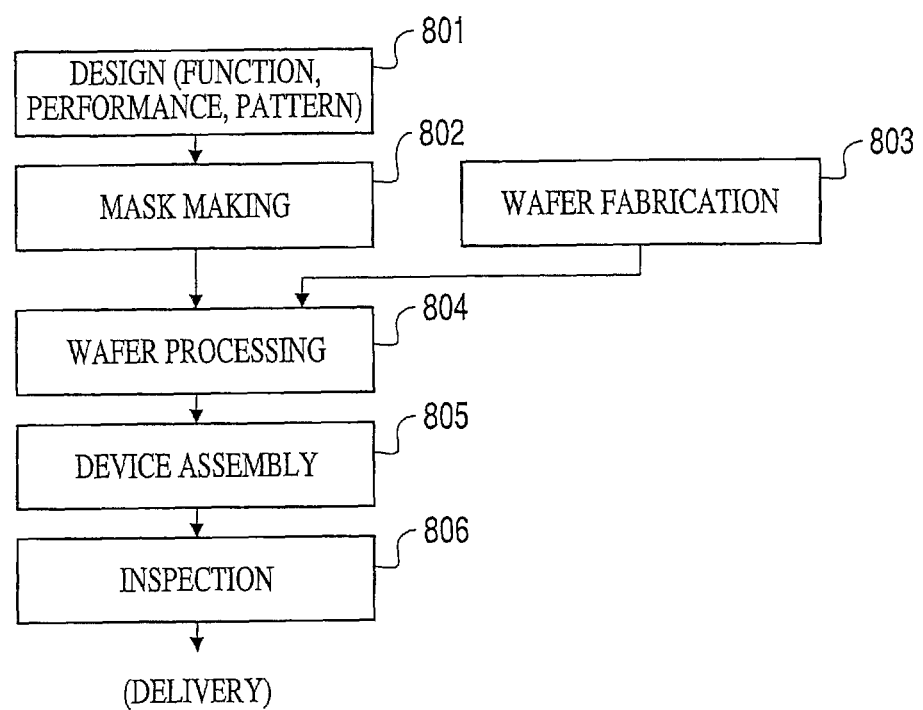
FIGS. 11A and 11B are flow diagrams illustrating the sequence of fabricating semiconductor wafers according to an aspect of the invention.

Semiconductor devices can be fabricated using the above described systems, by the process shown generally in FIG. 11A. In step 801 the device's function and performance characteristics are designed. Next, in step 802, a mask (reticle) having a pattern is designed according to the previous designing step, and in a step 803, a wafer is made from a silicon material. The mask pattern designed in step 802 is exposed onto the wafer from step 803 in step 804 by a photolithography system described hereinabove in accordance with aspects of the invention. In step 805, the semiconductor device is assembled (including the dicing process, bonding process and packaging process). Finally, the device is then inspected in step 806.

Figure 11B:
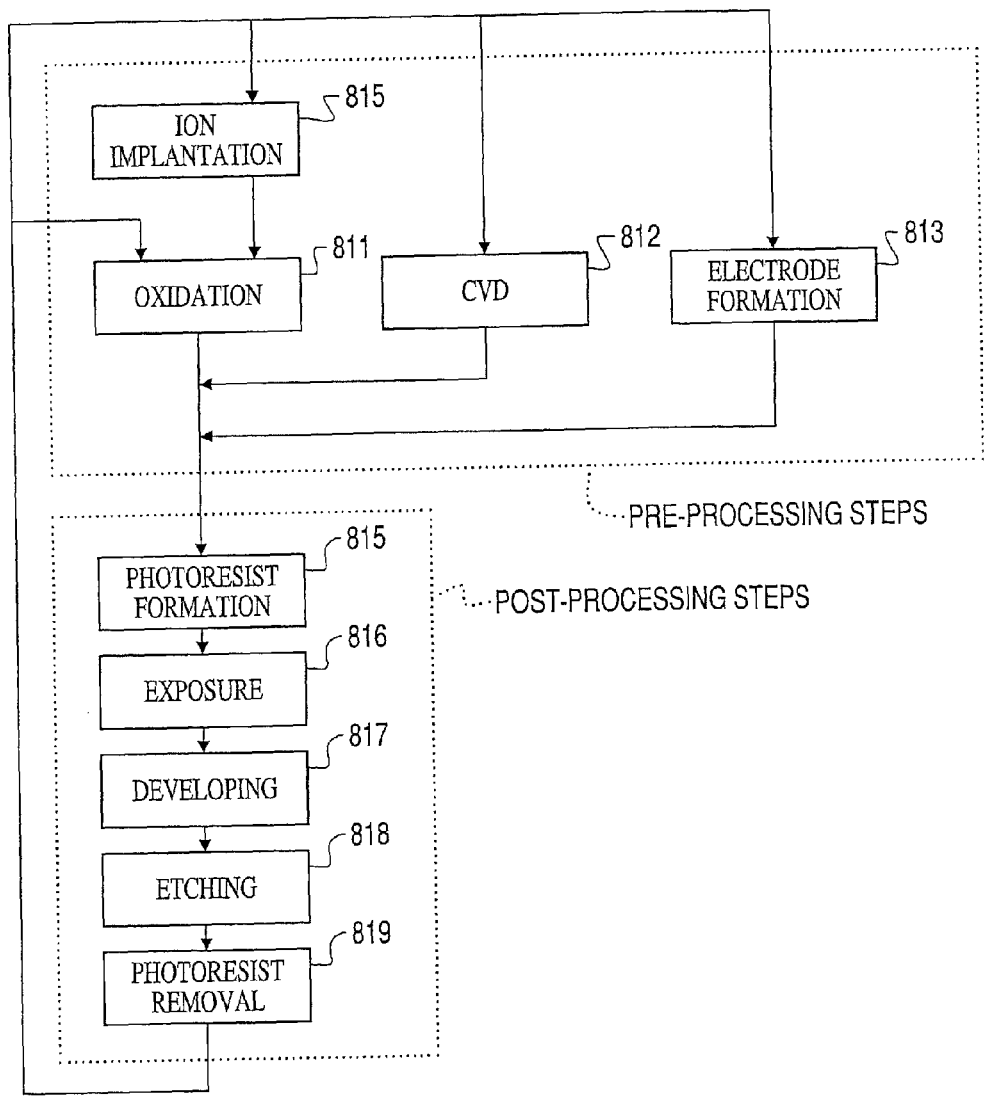

FIG. 11B illustrates a detailed flowchart example of the above-mentioned step 804 in the case of fabricating semiconductor devices. In FIG. 11B, in step 811 (oxidation step), the wafer surface is oxidized. In step 812 (CVD step), an insulation film is formed on the wafer surface. In step 813 (electrode formation step), electrodes are formed on the wafer by vapor deposition. In step 814 (ion implantation step), ions are implanted in the wafer. The above mentioned steps 811-814 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 815 (photoresist formation step), photoresist is applied to a wafer. Next, in step 816 (exposure step), the above-mentioned exposure device is used to transfer the circuit pattern of a mask (reticle) to a wafer. Then in step 817 (developing step), the exposed wafer is developed, and in step 818 (etching step), parts other than residual photoresist (exposed material surface) are removed by etching. In step 819 (photoresist removal step), unnecessary photoresist remaining after etching is removed. Multiple circuit patterns are formed by repetition of these preprocessing and post-processing steps.

A photolithography system (an exposure apparatus) according to the embodiments described herein can be built by assembling various subsystems in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes providing mechanical interfaces, electrical circuit wiring connections and air pressure plumbing connections between each subsystem. Each subsystem also is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

While the invention has been described with reference to preferred embodiments thereof, it is to be understood that the invention is not limited to the preferred embodiments or constructions. The invention is intended to cover various modifications and equivalent arrangements. In addition, while the various elements of the preferred embodiments are shown in various combinations and configurations, that are exemplary, other combinations and configurations, including more, less or only a single element, are also within the spirit and scope of the invention.

What is claimed is:

1. An immersion lithography apparatus comprising:
   a substrate holder on which a substrate is held;
   a projection system having a final optical element, the projection system projecting an exposure beam onto the substrate held on the substrate holder through an immersion liquid in a gap between a surface of the substrate and the final optical element during an exposure operation;
   a liquid confinement member having an aperture through which the exposure beam is projected, the liquid confinement member having a lower surface that surrounds the aperture, the lower surface of the liquid confinement member including a non-fluid removal area that surrounds the aperture, the liquid confinement member having a liquid recovery outlet from which the immersion liquid is recovered; and
   a movable member that is movable relative to the liquid confinement member in a substantially horizontal direction, the movable member having an opening through which the exposure beam is projected, the movable member having an upper surface and a lower surface that surround the opening, the movable member being movable while a portion of the upper surface faces the non-fluid removal area in the lower surface of the liquid confinement member,
   wherein the aperture of the liquid confinement member is defined by a radially innermost edge of the non-fluid removal area, and at least a part of the upper surface of the movable member is spaced from the substrate held on the substrate holder by a shortest distance that is less than a shortest distance between the substrate and the radially innermost edge of the non-fluid removal area.

2. The apparatus of claim 1, wherein the movable member moves in a same direction as the substrate holder when the substrate holder moves the substrate in a direction parallel to the surface of the substrate.

3. The apparatus of claim 2, wherein the movable member moves at a speed that is slower than a speed at which the substrate holder moves.

4. The apparatus of claim 3, wherein the movable member moves by an amount that is less than an amount by which the substrate holder moves.

5. The apparatus of claim 2, wherein the movable member moves by an amount that is less than an amount by which the substrate holder moves.

6. The apparatus of claim 1, further comprising an actuator coupled to the movable member to move the movable member.

7. The apparatus of claim 6, wherein the actuator is one of a voice coil motor and a Lorentz-force actuator.

8. The apparatus of claim 1, wherein the movable member includes a plate having the opening.

9. The apparatus of claim 1, wherein the movable member includes a plurality of plates that collectively define the opening.

10. The apparatus of claim 1, wherein the opening is larger than the aperture.

11. The apparatus of claim 1, wherein the movable member is movable to a closing position at which the upper surface of the movable member covers the aperture.

12. The apparatus of claim 1, wherein the liquid confinement member substantially surrounds the final optical element of the projection system.

13. The apparatus of claim 1, wherein the movable member is angled.

14. The apparatus of claim 1, wherein the movable member includes a protrusion that extends toward the substrate.

15. The apparatus of claim 14, wherein the protrusion is formed along the opening.

16. The apparatus of claim 1, wherein the liquid recovery outlet is provided in the lower surface of the liquid confinement member.

17. An immersion lithography apparatus comprising:
    a substrate holder on which a substrate is held;
    a projection system having a final optical element, the projection system projecting an exposure beam onto the substrate held on the substrate holder through an immersion liquid in a gap between a surface of the substrate and the final optical element during an exposure operation;
    a first member having an opening through which the exposure beam is projected; and
    a second member having an opening through which the exposure beam is projected,
    wherein the first and second members are relatively movable in a direction substantially parallel to the surface of the substrate,
    one of the first and second members has a lower surface,
    the lower surface includes a non-fluid removal area that surrounds the opening of the one of the first and second members,
    the other of the first and second members has an upper surface,
    the first and second members are relatively movable while a portion of the upper surface faces the non-fluid removal area in the lower surface,
    the one of the first and second members has a liquid recovery outlet which removes liquid from a gap between the lower surface and the upper surface, and
    the opening of the one of the first and second members is defined by a radially innermost edge of the non-fluid removal area, and at least a part of the upper surface of the other of the first and second members is spaced from the substrate held on the substrate holder by a shortest distance that is less than a shortest distance between the substrate and the radially innermost edge of the non-fluid removal area.

18. The apparatus of claim 17, wherein the one of the first and second members has the liquid recovery outlet in the lower surface.

19. The apparatus of claim 17, wherein the liquid recovery outlet faces a portion of the upper surface when the first and second members are relatively moved.

* * * * *